United States Patent
Wang (10) Patent No.: US 12,353,124 B2
(45) Date of Patent: Jul. 8, 2025

(54) LITHOGRAPHY METHOD, LITHOGRAPHY APPARATUS, AND COMPUTER STORAGE MEDIUM

(71) Applicant: CHANGXIN MEMORY TECHNOLOGIES, INC., Hefei (CN)

(72) Inventor: Heng Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 574 days.

(21) Appl. No.: 17/851,623

(22) Filed: Jun. 28, 2022

(65) Prior Publication Data

US 2023/0140774 A1  May 4, 2023

(30) Foreign Application Priority Data

Nov. 2, 2021 (CN) .......................... 202111287054.7

(51) Int. Cl.
*G03F 1/42* (2012.01)

(52) U.S. Cl.
CPC ...................................... *G03F 1/42* (2013.01)

(58) Field of Classification Search
CPC .... G03F 1/42; G03F 7/70525; G03F 7/70558; G03F 7/70975; G03F 7/7055
See application file for complete search history.

(56) References Cited

U.S. PATENT DOCUMENTS

| | | | |
|---|---|---|---|
| 6,346,979 B1 * | 2/2002 | Ausschnitt | G03F 7/70558 355/53 |
| 11,112,701 B2 * | 9/2021 | Nishimura | H01L 21/67276 |
| 2005/0270613 A1 * | 12/2005 | Hintersteiner | G03F 7/70041 359/237 |
| 2007/0275329 A1 | 11/2007 | Ziger et al. | |
| 2019/0285988 A1 * | 9/2019 | Osaka | G03F 7/702 |

FOREIGN PATENT DOCUMENTS

| | | |
|---|---|---|
| CN | 1882883 A | 12/2006 |
| CN | 112415866 A | 2/2021 |

* cited by examiner

*Primary Examiner* — Hung V Nguyen
(74) *Attorney, Agent, or Firm* — Syncoda LLC; Feng Ma (57) ABSTRACT

Embodiments of the present disclosure disclose a lithography method, a lithography apparatus, and a computer storage medium. The method includes: determining an exposure intensity of a mask aligner; determining a target preset interval corresponding to the mask aligner according to the exposure intensity; determining, according to the target preset interval, at least one target wafer for which at least one exposure dose is a target exposure dose, the target preset interval has a corresponding relationship with the target exposure dose; and performing lithography process on the at least one target wafer by using the mask aligner.

16 Claims, 8 Drawing Sheets

LITHOGRAPHY METHOD, LITHOGRAPHY APPARATUS, AND COMPUTER STORAGE MEDIUM

CROSS-REFERENCE TO RELATED APPLICATION

The present application claims priority to Chinese Patent Application No. 202111287054.7, filed on Nov. 2, 2021. The disclosure of Chinese Patent Application No. 202111287054.7 is hereby incorporated by reference in its entirety.

BACKGROUND

Generally, an exposure principle of a mask aligner (also referred to as an exposure machine) is that a beam of light is generated through laser, then imaging is performed through reflection or refraction of mirrors or lenses in a diffractive optical element (DOE).

During using the mask aligner, as the beam of light of the laser constantly irradiates the mirrors or lenses in the optical path, the mirrors or lenses will undergo oxidation reaction and produce atomization, which would decrease the reflectivity or refractive index of the mirrors or lenses, then decrease exposure intensity on a wafer. With the intensification of atomization, the exposure intensity will be further decreased. However, if the exposure intensity is too low, an exposure time will increase, which will reduce a production volume of the mask aligner severely and affect a production capability of the mask aligner.

SUMMARY

The present disclosure relates to the field of semiconductor technologies, and in particularly, to a lithography method, a lithography apparatus, and a computer storage medium.

The technical solutions of the present disclosure are implemented by using the following operations.

According to a first aspect of embodiments of the present disclosure, a lithography method is provided, the method includes:
  determining an exposure intensity of a mask aligner;
  determining a target preset interval corresponding to the mask aligner according to the exposure intensity;
  determining, according to the target preset interval, at least one target wafer for which at least one exposure dose is a target exposure dose, the target preset interval has a corresponding relationship with the target exposure dose; and
  performing lithography process on the at least one target wafer by using the mask aligner.

According to a second aspect of embodiments of the present disclosure, a lithography apparatus is further provided, which includes a memory and a processor.

The memory is configured to store a computer program executable on the processor.

The processor is configured to perform, when executing the computer program, the lithography method according to the first aspect.

According to a third aspect of embodiments of the present disclosure, a non-transitory computer storage medium having stored therein a computer program is provided, the computer program, when executed by at least one processor, performs the lithography method according to the first aspect.

DETAILED DESCRIPTION

The technical solutions in embodiments of the present disclosure will be described clearly and completely with reference to accompanying drawings in the implementations of the present disclosure. It may be understood that, specific embodiments described herein are merely used for illustrating the disclosure rather than limiting the disclosure. Additionally, it should be noted that, for ease of description, only parts related to the disclosure are shown in the accompanying drawings.

Unless otherwise defined, all technical and scientific terms used herein have the same meaning as those normally understood by persons skilled in the art of the present disclosure. The terms used herein in the specification are intended only to describe the embodiments of the present disclosure rather than limit the present disclosure.

In the following descriptions, "some embodiments" describes subsets of all possible embodiments. However, it may be understood that, "some embodiments" may be same subsets or different subsets of all the possible embodiments, and may combine with each other without conflict.

It is to be noted that, terms of "first\second\third" involved in the embodiments of the present disclosure are only to distinguish similar objects, and do not represent a specific order for objects. It may be understood that, "first\second\third" may change a specific order or sequence with each other if permitted, so that the embodiments of the present disclosure described herein can be implemented in another sequence than a sequence shown or described herein.

An exposure principle of a mask aligner is that a beam of light is generated through laser, then imaging is performed through reflection and refraction of mirrors or lenses in a diffractive optical element (DOE). During using the mask aligner, an exposure intensity through the DOE decides an exposure time. If the exposure intensity is too low, an exposure time will increase, which greatly reducing a production capability of the mask aligner. As the beam of light of the laser constantly irradiates the mirrors or lenses in the optical path of the mask aligner, the mirrors or lenses will undergo oxidation reaction and produce atomization, which would decrease the reflectivity or refractive index of the mirrors or lenses, then decrease exposure intensity on a wafer. With the intensification of atomization, the exposure intensity will be further decreased.

Since lower exposure intensity leads to longer exposure time, a quantity of wafers which may be processed by the mask aligner within a same process time is decreased, that is, the production capability of the mask aligner is reduced. The production capability of the mask aligner indicates a quantity of wafers which can be processed by the mask aligner in a unit time (such, one hour). In addition, in order to restore the production capability of the mask aligner, the atomized mirror needs to be replaced, which increases the cost. Therefore, embodiments of the present disclosure provide a lithography method, which relates to semiconductor lithography exposure technologies, and can alleviate a production capacity loss of the mask aligner, improve the production capability of the mask aligner, and reduce the cost due to the replacement of the mirror.

Some embodiments of the present disclosure will be described in details with reference to the accompanying drawings in the following.

Figure 1:
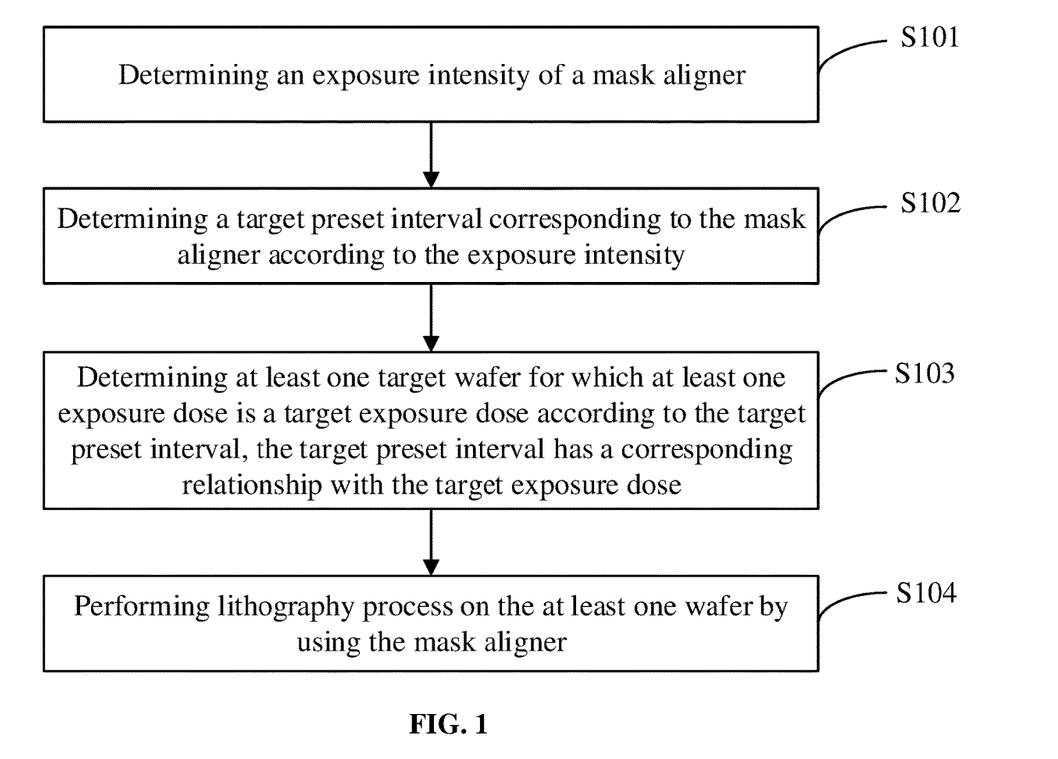
FIG. 1 is a schematic flowchart of a lithography method according to some embodiments of the present disclosure.

In an implementation of the present disclosure, FIG. 1 shows a schematic flowchart of a lithography method according to some embodiments of the present disclosure. As shown in FIG. 1, the method includes the following operations.

At S101, an exposure intensity of a mask aligner is determined.

It is to be noted that, the lithography method provided in the embodiments of the present disclosure is applied to a lithographic apparatus, such as a mask aligner, or to a dispatch device configured to dispatch the mask aligner, for example, a real time dispatch (RTD) system. With the method, the use of the mask aligner is more reasonable.

It may be understood that, as the use time of the mask aligner increases, a mirror in an optical path of the mask aligner may produce atomization due to oxidation reaction, thereby decreasing the exposure intensity. As a result, the exposure time when a lithography process is performed on a wafer is increased, which affects the production capability of the mask aligner.

Figure 2:
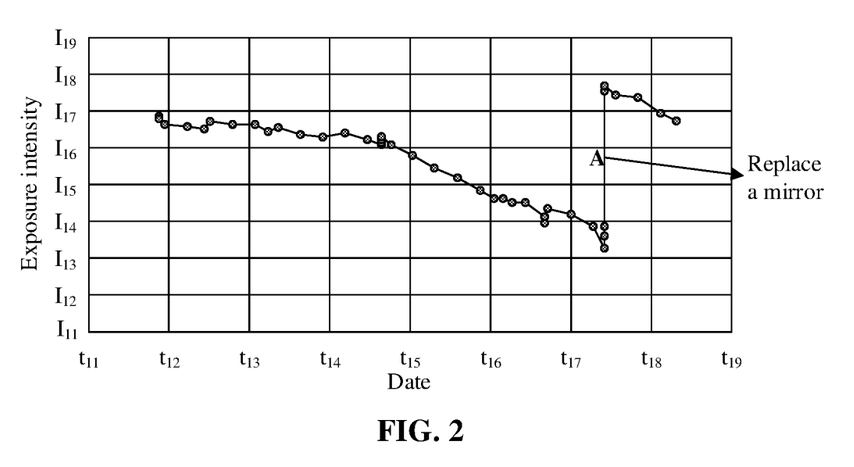
FIG. 2 is a schematic diagram of changes in exposure intensity according to some embodiments of the present disclosure.

For example, FIG. 2 shows a schematic diagram of changes in exposure intensity according to some embodiments of the present disclosure. Dates are shown horizontally, "$t_{11}, t_{12}, t_{13} \ldots$" represent specific time points, and the dates gradually increase from left to right. Exposure intensities are shown longitudinally. "$I_{11}, I_{12}, I_{13} \ldots$" represent specific exposure intensity values, and the exposure intensities gradually increase from bottom to top. The unit of the exposure intensity may be megawatts per square centimeter (mW/cm$^2$). FIG. 2 shows changes in exposure intensity at several time points of a mask aligner with a specific type.

As shown in FIG. 2, before a time point A, as the use time increases, the exposure intensity of the mask aligner gradually decreases. The replacement of mirror is performed at the time point A. In this case, the exposure intensity returns to a high value because a new mirror is replaced.

The exposure time is increased due to too low exposure intensity, so that a production capability of the mask aligner is reduced. Also, the mirror needs to be replaced when the exposure intensity is too low, which increases the cost. Therefore, according to the lithography method provided in some embodiments of the present disclosure, a mask aligner and a to-be-processed wafer are dispatched reasonably based on a current exposure intensity of the mask aligner, so as to avoid a low production capability of the mask aligner due to the decreasing of the exposure intensity.

In some embodiments, the operation of determining the exposure intensity of the mask aligner may include the following operations:

an operation state parameter of the mask aligner is determined; and an exposure analysis is performed on the operation state parameter to determine the exposure intensity of the mask aligner.

It should be noted that, during the operation procedure of the mask aligner, the operation state parameter of the mask aligner needs to be adjusted, to achieve a best process effect. The operation state parameter of the mask aligner may include, but not limited to, one or more of: a spot size, a wavelength, a defocusing degree, a working space size, a grid size, a scan speed, a step size, and the like.

In some embodiments of the present disclosure, an exposure intensity which can be achieved by a mask aligner may be determined by adjusting each operation state parameter to a maximum value or an optimum value. For example, the exposure intensity of the mask aligner may be obtained by testing the exposure intensity after the laser passes through the mirror, such that lithography process is performed according to the exposure intensity in subsequent operations, to obtain a best lithograph effect of the mask aligner.

At S102, a target preset interval corresponding to the mask aligner is determined according to the exposure intensity.

At S103, at least one target wafer for which at least one exposure dose is a target exposure dose is determined according to the target preset interval. The target preset interval has a corresponding relationship with the target exposure dose.

It should be noted that, after the exposure intensity of the mask aligner is determined, the target preset interval corresponding to the mask aligner is determined according to the exposure intensity. The target preset interval is determined from multiple preset intervals according to the exposure intensity. Each preset interval represents a range of exposure intensities.

For example, if there are three preset intervals, namely: an interval 1: $\{I | I < I_1\}$, an interval 2: $\{I | I_1 \leq I < I_2\}$, and an interval 3: $\{I | I \geq I_2\}$, I represents the exposure intensity, $I_1$ and $I_2$ represent different exposure intensities, and the exposure intensity of $I_1$ is less than the exposure intensity of $I_2$. If it is determined that the current exposure intensity, that is, the exposure intensity I, of the mask aligner is between $I_1$ and $I_2$, then it may be determined that a current target preset interval corresponding to the mask aligner is the interval 2.

In a specific embodiment, a value of $I_1$ may range from 3000 mW/cm$^2$ to 6000 mW/cm$^2$, for example, may be 3500 mW/cm$^2$, 4000 mW/cm$^2$, 4500 mW/cm$^2$, 5500 mW/cm$^2$, or 5800 mW/cm$^2$. A value of $I_2$ may range from 6000 mW/cm$^2$ to 8000 mW/cm$^2$, for example, may be 6200 mW/cm$^2$, 6500 mW/cm$^2$, 6800 mW/cm$^2$, 7000 mW/cm$^2$, or 7500 mW/cm$^2$.

After the target preset interval is determined, at least one target wafer for which at least one exposure dose is the target exposure dose may be determined based on a corresponding relationship between a target preset interval and a target exposure dose.

It should be noted that, in some embodiments of the present disclosure, the target preset interval has the corresponding relationship with the target exposure dose. The corresponding relationship represents that, in a case that an exposure dose required for performing lithograph process on the wafer is the target exposure dose, when the wafer is processed based on the exposure intensity in the target preset interval, an exposure time may not change due to changes in the exposure intensity in the target preset interval.

Therefore, according to some embodiments of the present disclosure, the at least one target wafer for which the at least one exposure dose is the target exposure dose is determined. Because exposure doses for those target wafers are the target exposure dose, the exposure time may not increase when the lithography process is performed on the wafer by using the mask aligner, thereby avoiding the reduction of the production capability of the mask aligner.

Further, the target preset interval may be determined from multiple preset intervals. A manner of determining the preset interval is also provided in the embodiments of the present disclosure. In some embodiments, the method may further include the following operations:

at least one corresponding relationship between an exposure intensity and an exposure time under at least one exposure dose is determined; and a preset interval corresponding to each of the at least one exposure dose is determined according to a respective corresponding relationship between an exposure intensity and an exposure time under the exposure dose, the preset interval is used for indicating that the exposure time in the preset interval under the exposure dose remains unchanged.

It should be noted that, when lithography process is performed on wafers, the wafers need different exposure doses under different conditions such as different batches and different performance requirements. Therefore, according to the embodiments of the present disclosure, at least one corresponding relationship between an exposure intensity and an exposure time under at least one exposure dose is determined respectively, that is, a corresponding relationship between an exposure intensity and an exposure time under each different exposure dose for the wafer is determined.

Figure 3:
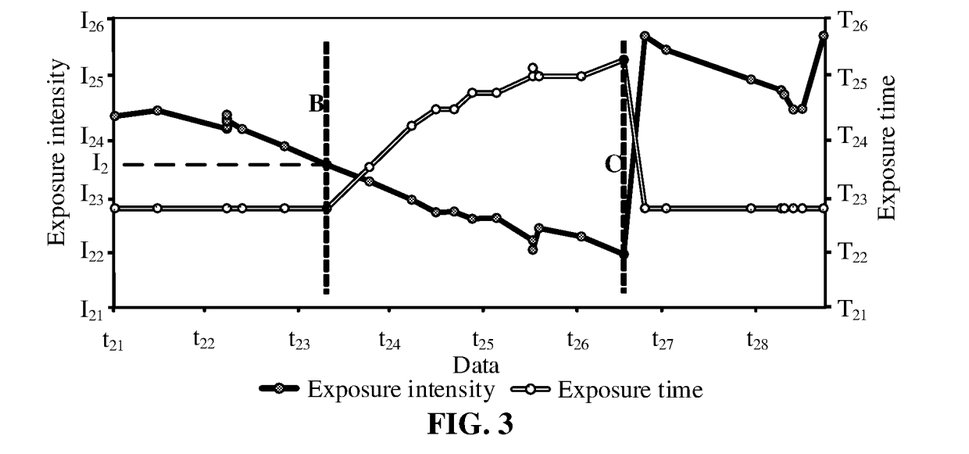
FIG. 3 is a schematic diagram of a corresponding relationship between an exposure intensity and an exposure time according to some embodiments of the present disclosure.

For example, FIG. 3 is a schematic diagram of a corresponding relationship between an exposure intensity and an exposure time according to some embodiments of the present disclosure when the exposure dose is a first exposure dose Dose 1. Dates are shown horizontally, "$t_{21}$, $t_{22}$, $t_{23}$ . . . " represent specific time points. The dates gradually increase from left to right. Exposure intensities are shown longitudinally on the left side, "$I_{21}$, $I_{22}$, $I_{23}$ . . . " represent specific exposure intensity values. The exposure intensities gradually increase from bottom to top. The unit of the exposure intensity may be megawatts per square centimeter ($mW/cm^2$). The black polyline represents changes in the exposure intensity. The exposure times are shown longitudinally on the right side. "$T_{21}$, $T_{22}$, and $T_{23}$ . . . " represent specific exposure time values The exposure times gradually increase from bottom to top. The unit of the exposure time may be second(s). The white solid line represents changes in the exposure time.

As shown in FIG. 3, before a time point B, as the use time increases, the exposure intensity is decreased, but the exposure time remains unchanged. Between the time point B and a time point C, the exposure intensity is further decreased, and the exposure time starts to increase. At the time point C, the mirror is replaced, the exposure intensity returns to a high value, and the exposure time returns to a low value accordingly.

That is, in the example as shown in FIG. 3, under the first exposure dose Dose 1, the exposure time does not increase as long as the exposure intensity is greater than an exposure intensity $I_2$ corresponding to the time point B, and the production capability of the mask aligner is not affected as well. That is, when the exposure dose is the first exposure dose Dose 1, the preset interval corresponding to the first exposure dose Dose 1 is $\{I|I \geq I_2\}$.

As such, a preset interval corresponding to each of different exposure doses is determined by using a respective corresponding relationship between an exposure intensity and an exposure time under the exposure doses. Only if the exposure intensity of the mask aligner meets the preset interval and the exposure dose required by the wafer is the exposure dose corresponding to the preset interval, the exposure time does not increase when the wafer is processed by using the mask aligner, and the production capability of the mask aligner is not affected.

In some embodiments, the at least one exposure dose at least includes a first exposure dose and a second exposure dose; and the operation of determining the preset interval corresponding to each of the at least one exposure dose according to the respective corresponding relationship between the exposure intensity and the exposure time under the exposure dose may include the following operations:

a first preset interval corresponding to the first exposure dose is determined according to a corresponding relationship between an exposure intensity and an exposure time under the first exposure dose; and a second preset interval corresponding to the second exposure dose is determined according to a corresponding relationship between an exposure intensity and an exposure time under the second exposure dose.

It should be noted that, the at least one exposure dose may at least include the first exposure dose and the second exposure dose. For the first exposure dose, the first preset interval corresponding to the first exposure dose can be determined according to the corresponding relationship between the exposure intensity and the exposure time under the first exposure dose. For the second exposure dose, the second preset interval corresponding to the second exposure dose can be determined according to the corresponding relationship between the exposure intensity and the exposure time under the second exposure dose.

In some embodiments, the operation of determining the second preset interval corresponding to the second exposure dose according to the corresponding relationship between the exposure intensity and the exposure time under the second exposure dose may include the following operations:

a third preset interval corresponding to the second exposure dose is determined according to the corresponding relationship between the exposure intensity and the exposure time under the second exposure dose; and the second preset interval corresponding to the second exposure dose is determined according to the third preset interval and the first preset interval.

It should be noted that, for the second exposure dose, when the second preset interval corresponding to the second exposure dose is determined, the third preset interval corresponding to the second exposure dose is firstly determined according to the corresponding relationship between the exposure intensity and the exposure time under the second exposure dose. Then the second preset interval corresponding to the second exposure dose is determined according to the third preset interval and the first preset interval.

In a specific implementation, a value of the first exposure dose Dose 1 may range from 30 $mj/cm^2 \cdot s$ to 120 $mj/cm^2 \cdot s$, for example, may be 40 $mj/cm^2 \cdot s$, 50 $mj/cm^2 \cdot s$, 65 $mj/cm^2 \cdot s$, 80 $mj/cm^2 \cdot s$, or 100 $mj/cm^2 \cdot s$. A value of the second exposure dose Dose 2 may range from 20 $mj/cm^2 \cdot s$ to 110 mj/cm²·s, for example, may be 30 mj/cm²·s, 46 mj/cm²·s, 60 mj/cm²·s, 70 mj/cm²·s, or 90 mj/cm²·s.

A manner for determining the second preset interval is described with reference to a specific embodiment in the following.

Figure 4:
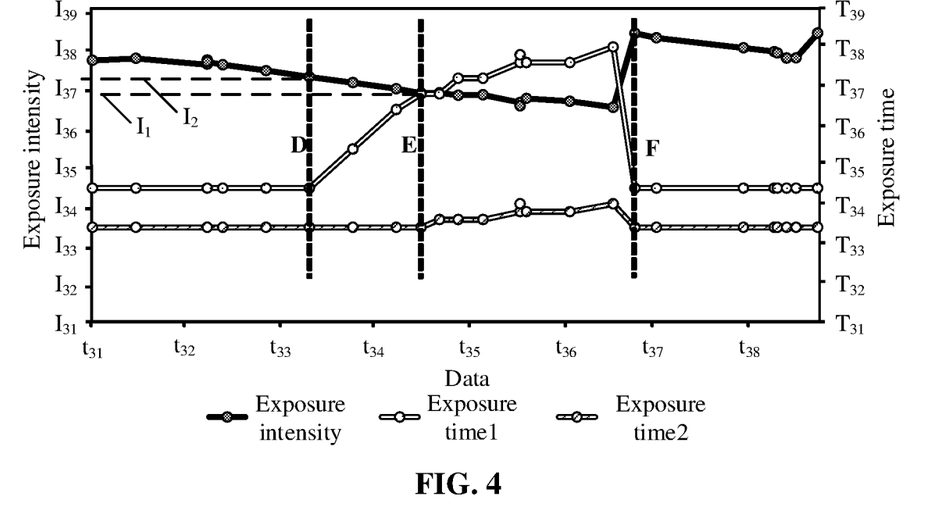
FIG. 4 is a schematic diagram of another corresponding relationship between an exposure intensity and an exposure time according to some embodiments of the present disclosure.

For example, FIG. 4 is a schematic diagram of another corresponding relationship between an exposure intensity and an exposure time when the exposure dose is the first exposure dose Dose 1 and the second exposure dose Dose 2 respectively according to some embodiments of the present disclosure. An exposure dose of the first exposure dose Dose 1 is greater than an exposure dose of the second exposure dose Dose 2. In FIG. 4, dates are shown horizontally, "$t_{31}$, $t_{32}$, $t_{33}$ . . . " represent specific time points. The dates gradually increase from left to right. Exposure intensities are shown longitudinally on the left side, "$I_{31}$, $I_{32}$, $I_{33}$ . . . " represent specific exposure intensity values, and the exposure intensities gradually increase from bottom to top. The unit of the exposure intensity may be mW/cm2. The black polyline represents changes in the exposure intensity. Exposure times are shown longitudinally on the right side. "$T_{31}$, $T_{32}$, and $T_{33}$ . . . " represent specific exposure time values, and the exposure times gradually increase from bottom to top. The unit of the exposure time may be second(s). The white solid line represents the exposure times vs the time points when the exposure dose is the first exposure dose Dose 1 (remarked as an exposure time 1). A polyline filled with slash patterns represents the exposure times vs the time points when the exposure dose is the second exposure dose Dose 2 (remarked as an exposure time 2).

As shown in FIG. 4, before the time point D, as the use time increases, the exposure intensity is decreased, and both the exposure time 1 and the exposure time 2 remain unchanged. Between the time point D and the time point E, when the exposure intensity is further decreased, the exposure time 1 starts to increase, and the exposure time 2 still remains unchanged. Between the time point E and a time point F, both the exposure time 1 and the exposure time 2 are increased. After the time point F, the mirror is replaced, the exposure intensity returns to a high value, and the exposure time 1 and the exposure time 2 return to low values accordingly.

That is, in the example shown in FIG. 4, for the first exposure dose Dose 1, the exposure time does not increase as long as the exposure intensity can remain larger than an exposure intensity $I_2$ corresponding to the time point D, that is, the first preset interval corresponding to the first exposure dose Dose 1 is $\{I|I \geq I_2\}$. For the second exposure dose Dose 2, the exposure time does not increase as long as the exposure intensity can remain larger than an exposure intensity $I_1$ corresponding to the time point E, that is, the third preset interval corresponding to the second exposure dose Dose 2 is $\{I|I \geq I_1\}$.

As such, for the first exposure dose Dose 1 and the second exposure dose Dose 2, an exposure intensity interval (that is, the third preset interval) in which the exposure time corresponding to the second exposure dose Dose 2 remains unchanged contains the first preset interval. If the third preset interval is used as a preset interval corresponding to the second exposure dose Dose 2, when an exposure intensity of the mask aligner is greater than the exposure intensity $I_2$, the exposure intensity may meet both of the two preset intervals. On the contrary, the mask aligner can have better effect when the first preset interval is determined as the target preset interval, and energy waste may not be caused. If the third preset interval is determined as the target preset interval, the energy waste may be caused. That is, when the exposure intensity can ensure that the exposure time is constant for different exposure doses, the exposure dose that requires higher exposure intensity may be selected preferentially, so that energy can be used more efficiently, and energy waste is avoided.

Therefore, when the second preset interval corresponding to the second exposure dose is determined, an intersected part of the third preset interval and the first preset interval are deleted, and a part in the third preset interval other than the first preset interval is selected as the second preset interval. That is, for the example shown in FIG. 4, the second preset interval corresponding to the second exposure dose is $\{I|I_1 \leq I \leq I_2\}$.

That is, in the embodiments of the present disclosure, when preset intervals corresponding to respective exposure doses are determined, if an initial interval (such as, the foregoing third preset interval) in which exposure time corresponding to a respective exposure dose (such as, the foregoing second exposure dose) remains unchanged contains a preset interval (such as, the foregoing first preset interval) corresponding to another exposure dose (such as, the foregoing first exposure dose), the preset interval corresponding to the another exposure dose is deleted from the initial interval to obtain a corresponding preset interval. Not only the mask aligner can be used more reasonable, but also a resource waste caused by dispatching a mask aligner with a relatively high exposure intensity to a wafer with a low exposure dose when two intervals include an overlapped part is avoided.

In some embodiments, when the exposure intensity is in the first preset interval, it may be determined that the target preset interval is the first preset interval. Accordingly, the operation of determining, according to the target preset interval, at least one target wafer for which the at least one exposure dose is the target exposure dose may include the following operations:

an exposure dose for a to-be-processed wafer is obtained; and in a case that the exposure dose for the to-be-processed wafer is the first exposure dose, the to-be-processed wafer is determined as the target wafer.

It should be noted that, when the determined exposure intensity is in the first preset interval, it is determined that the target preset interval is the first preset interval. The exposure dose corresponding to the first preset interval is the first exposure dose, and in this case, the to-be-processed wafer for which the exposure dose is the first exposure dose is determined as the target wafer.

In some embodiments, when the exposure intensity is in the second preset interval, it is determined that the target preset interval is the second preset interval. Accordingly, the operation of determining, according to the target preset interval, at least one target wafer for which the at least one exposure dose is the target exposure dose may include the following operations:

an exposure dose for a to-be-processed wafer is obtained; and in a case that the exposure dose for the to-be-processed wafer is the second exposure dose, the to-be-processed wafer is determined as the target wafer.

It should be noted that, when the determined exposure intensity is in the second preset interval, it is determined that the target preset interval is the second preset interval. The exposure dose corresponding to the second preset interval is the second exposure dose, and in this case, the to-be-processed wafer for which the exposure dose is the second exposure dose is determined as the target wafer.

That is, after the exposure dose for the to-be-processed wafer is obtained, if a preset interval corresponding to an exposure dose for the to-be-processed wafer is the same as a preset interval corresponding to an exposure intensity of a mask aligner, the mask aligner only performs lithography process on a wafer with a corresponding exposure dose, the use of the mask aligner can be more reasonable.

After the exposure intensity of the mask aligner is determined, whether to replace the mirror may be determined according to the exposure intensity. Therefore, in some embodiments, the method may further include the following operations:

warning information is outputted in a case that the exposure intensity is less than a preset lower limit value, the warning information is used for prompting to replace a mirror of the mask aligner; and the step of determining the target preset interval corresponding to the mask aligner according to the exposure intensity is performed in a case that the exposure intensity is greater than or equal to the preset lower limit value.

It should be noted that, in order to improve the production capability of the mask aligner and save the cost, if the exposure intensity is less than the preset lower limit value, the mirror of the mask aligner needs to be replaced. The preset lower limit value represents an exposure intensity value determined through experiment verification or other manners. When the exposure intensity is lower than the preset lower limit value, the production capability of the mask aligner may not be maintained if the atomized mirror is still used. In this case, the warning information is outputted to prompt the technician to replace the mirror of the mask aligner.

That is, if the exposure intensity is too low, according to the embodiments of the present disclosure, the mirror can be replaced in time when the exposure intensity is too low, to avoid reducing the production capability of the mask aligner.

If the exposure intensity is greater than or equal to the preset lower limit value, the target preset interval corresponding to the mask aligner is determined according to the exposure intensity to perform the subsequent operations.

It should be also noted that, when the preset interval includes the first preset interval and the second preset interval, the preset lower limit value may be the same as the lower limit value of the second preset interval (or the third preset interval).

Therefore, in some embodiments, after the exposure intensity of the mask aligner is determined, the method may further include the following operations:

warning information is outputted in a case that the exposure intensity is less than a preset lower limit value of the third preset interval, the warning information is used for prompting to replace a mirror of the mask aligner; and the operation of determining the target preset interval corresponding to the mask aligner according to the exposure intensity is performed, in a case that the exposure intensity is greater than or equal to the preset lower limit value of the third preset interval.

It should be noted that, still taking FIG. 4 as an example, the first preset interval corresponding to the first exposure dose is $\{I|I \geq I_2\}$, the second preset interval corresponding to the second exposure dose is $\{I|I_1 \leq I < I_2\}$, and the third preset interval corresponding to the second exposure dose is $\{I|I \geq I_1\}$. The preset lower limit value of the third preset interval (or the second preset interval) is $I_1$. That is, in this example, if the exposure intensity is less than $I_1$, the warning information for prompting to replace the mirror is outputted.

In addition, according to the embodiments of the present disclosure, when the preset interval is determined, a preset warning interval $\{I|I < a\}$ may also be determined, where a represents the preset lower limit value, and usually, a is equal to $I_1$. As such, when the exposure intensity meets the preset warning interval, the warning information is outputted.

For the mask aligner in FIG. 4, if the lithography method in the embodiments of the present disclosure is not performed, for the wafer for which the exposure dose is the first exposure dose, when the exposure intensity is less than $I_2$, the exposure time is increased. In this case, the automized mirror may be still used for lithography process, but the production capability of the mask aligner may be reduced due to the increasing of the exposure time; or the mirror may be replaced, but the cost for replacing the mirror is introduced. According to the lithography method provided in the embodiments of the present disclosure, if the exposure intensity is less than $I_2$ and greater than $I_1$, because the exposure time of the wafer for which the exposure dose is the second exposure dose is not increased in the exposure intensity range greater than $I_1$, the wafer for which the exposure dose is the second exposure dose is dispatched to the mask aligner for processing. In this case, although the exposure intensity is insufficient, the lithography process can still be performed on the wafer with the second exposure dose, the production capability of the mask aligner is maintained, the mirror does not need to be replaced, and the cost for replacing the mirror is also saved.

At S104, lithography process is performed on the at least one target wafer by using the mask aligner.

It should be noted that, after the at least one target wafer is determined, the lithography process is performed on the determined target wafer by using the mask aligner.

In some embodiments, the method may further include the following operations:

an exposure dose for a to-be-processed wafer in a current batch is determined;

in a case that the exposure dose is the target exposure dose, a target preset interval corresponding to the target exposure dose is determined;

a mask aligner of which the exposure intensity is in the target preset interval is determined according to the target preset interval; and the to-be-processed wafer in the current batch is dispatched to the mask aligner to perform lithography process.

It should be noted that, according to the embodiments of the present disclosure, an exposure dose for a to-be-processed wafer in a current batch may be determined firstly, and a target exposure dose the exposure dose for the to-be-processed wafer meets is determined. The target exposure dose is determined from multiple preset exposure doses according to the exposure dose for the to-be-processed wafer. For example, if the multiple exposure doses include a first exposure dose and a second exposure dose, when the exposure dose for the to-be-processed wafer is the first exposure dose, the first exposure dose is determined as the target exposure dose.

The corresponding target preset interval (i.e. an exposure intensity interval in which the exposure time is not changed under the target exposure dose) can be determined according to the target exposure dose, and then a mask aligner of which the exposure intensity is in the target preset interval is determined, to perform lithography process on the to-beprocessed wafer in the current batch according to the mask aligner, so as to improve the production capability of the mask aligner.

For example, if a first mask aligner corresponds to the first preset interval, and a second mask aligner corresponds to the second preset interval and the target preset interval is the first preset interval, then it is determined that the corresponding mask aligner is the first mask aligner. The to-be-processed wafer in the current batch is dispatched to the first mask aligner, and the first mask aligner is used to perform lithography process on the to-be-processed wafer.

According to the lithography method provided in the embodiments, an exposure intensity of a mask aligner is determined; a target preset interval corresponding to the mask aligner is determined according to the exposure intensity; at least one target wafer for which at least one exposure dose is a target exposure dose is determined according to the target preset interval, the target preset interval has a corresponding relationship with the target exposure dose; and lithography process is performed on the at least one target wafer by using the mask aligner. As such, by performing an interval division on the exposure intensity of the mask aligner, the mask aligner of which the exposure intensity belongs to the target preset interval can only perform lithography process on the wafer for which the exposure dose is the target exposure dose. Therefore, the use of the mask aligner can be more reasonable, not only the cost of replacing the mirror is reduced, but also a problem of an increasing exposure time caused by insufficient exposure intensity is avoided, thereby improving a production capability of the mask aligner.

Figure 5:
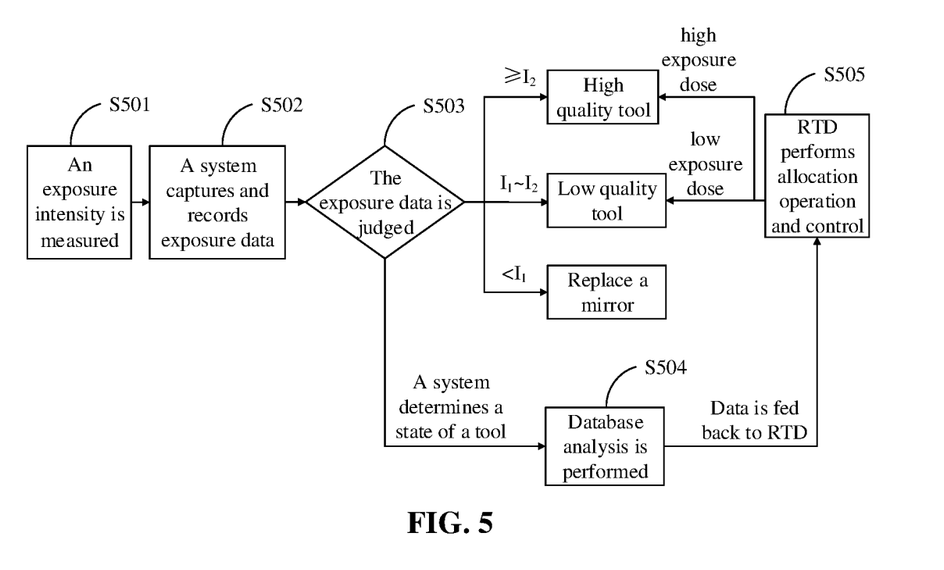
FIG. 5 is a detailed schematic flowchart of a lithography method according to some embodiments of the present disclosure.

In another implementation of the present disclosure, FIG. 5 shows a detailed schematic flowchart of a lithography method according to some embodiments of the present disclosure. As shown in FIG. 5, the detailed procedure may include the following operations.

At S501, an exposure intensity is measured.

It should be noted that, taking the mask aligner corresponding to FIG. 4 as an example, the exposure intensity of a mask aligner is measured.

At S502, a system captures and records exposure data.

It should be noted that, during using the mask aligner, the system used for performing the method procedure may capture exposure data of the mask aligner corresponding to different periods at different exposure doses, which mainly includes the exposure intensity and the exposure time. The record result may be shown in FIG. 4.

At S503, the exposure data is judged.

It should be noted that, the exposure data is analyzed to perform interval division on the exposure intensity. The exposure intensity may be divided into three preset intervals, namely: a first preset interval greater than or equal to $I_2$, corresponding to the first exposure dose having exposure dose of Dose 1, the first exposure dose is also referred to as a high exposure dose due to a relatively high value, and a mask aligner having an exposure intensity greater than $I_2$ is a high quality tool; a second preset interval between $I_1$ and $I_2$, corresponding to the second exposure dose having exposure dose of Dose 2, the second exposure dose is also referred to as a low exposure dose due to a relatively low value, and a mask aligner having an exposure intensity between $I_1$ and $I_2$ is a low quality tool; a preset warning interval in which the exposure intensity is less than $I_1$ and the mirror needs to be replaced.

At S504, database analysis is performed.

It should be noted that, during an actual production, the system firstly judges a tool state of the mask aligner, determines the exposure intensity of the mask aligner, performs database (corresponding relationships between exposure doses, preset intervals, exposure times, and the like are stored in the database) analysis, determines an exposure dose of the current mask aligner, and feeds back the data to the RTD system.

At S505, the RTD performs dispatch operation and control.

It should be noted that, RTD performs dispatch in real time according to the feedback data, to perform dispatch operations and control. If it is determined, according to the exposure intensity, that the mask aligner is a high quality tool, a to-be-processed wafer required for a high exposure dose (for example, the first exposure dose) is dispatched to the mask aligner for processing. If it is determined, according to the exposure intensity, that the mask aligner is a low quality tool, a to-be-processed wafer required for a low exposure dose (for example, the second exposure dose) is dispatched to the mask aligner for processing.

In the embodiments of the present disclosure, the change of the exposure time with the change of the exposure intensity of the mask aligner are systematically researched based on a large quantity of data., to obtain a corresponding relationship between the exposure intensity and the exposure time as follows.

For the first exposure dose Dose 1, when the exposure intensity is greater than $I_2$, the exposure time will not change. When the exposure intensity is less than $I_2$, the exposure time may gradually increase with the decreasing of the exposure intensity, that is, the production capability of the mask aligner is affected.

For the second exposure dose Dose 2, when the exposure intensity is greater than $I_1$, the exposure time will not change. When the exposure intensity is less than $I_1$, the exposure time may gradually increases with the decreasing of the exposure intensity, that is, the production capability of the mask aligner is affected.

It may be seen from FIG. 4 that in a high exposure dose requirement, the production capability of the mask aligner is not affected when the exposure intensity is greater than $I_2$, and in a low exposure dose requirement, the production capability of the mask aligner is not affected when the exposure intensity is greater than $I_1$. The system records exposure intensity performances of different mask aligners, to classify and obtain a high quality tool (a high quality tool group) and a low quality tool (a low quality tool group), so that a wafer having a high exposure dose requirement may be dispatched to the high quality tool group by the RTD.

Figure 6:
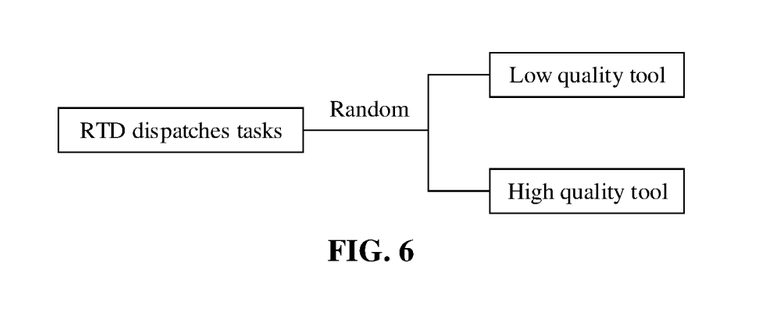
FIG. 6 is a schematic flowchart of a random delivery.

That is, the embodiments of the present disclosure provide a lithography method, and the specific implementations of the method are described in details by the foregoing embodiments. It may be seen that, compared with the random dispatch (FIG. 6 is a schematic flowchart of a random dispatch, that is, the wafer is dispatched randomly without distinguishing exposure intensities and exposure requirements, and the wafer may be dispatched to a high quality tool or a low quality tool) manner, the lithography method provided in the embodiments of the present disclosure may not affect the production capability of the mask aligner, and may reduce the cost for replacing the mirror, thereby extending the life of the mirror.

Figure 7:
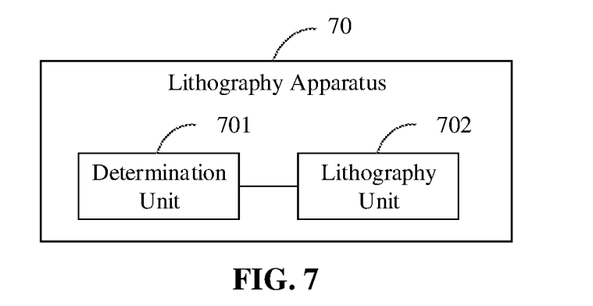
FIG. 7 is a schematic structural diagram of a lithography apparatus according to some embodiments of the present disclosure.

In another embodiment of the present disclosure, FIG. 7 is a schematic diagram of a composition structure of a lithography apparatus 70 according to the embodiment of the present disclosure. As shown in FIG. 7, the lithography apparatus includes a determination unit 701 and a lithography unit 702.

The determination unit 701 is configured to determine an exposure intensity of a mask aligner; determine a target preset interval corresponding to the mask aligner according to the exposure intensity; and determine at least one target wafer for which at least one exposure dose is a target exposure dose according to the target preset interval, the target preset interval has a corresponding relationship with the target exposure dose.

The lithography unit 702 is configured to perform lithography process on the at least one target wafer by using the mask aligner.

In some embodiments, the determination unit 701 is specifically configured to determine an operation state parameter of the mask aligner; and perform an exposure analysis on the operation state parameter to determine the exposure intensity of the mask aligner.

In some embodiments, the determination unit 701 is further configured to determine at least one corresponding relationship between an exposure intensity and an exposure time under at least one exposure dose; and determine a preset interval corresponding to each of the at least one exposure dose according to a respective corresponding relationship between an exposure intensity and an exposure time under the exposure dose, the preset interval is used for indicating that the exposure time in the preset interval under the exposure dose remains unchanged.

In some embodiments, the at least one exposure dose at least includes a first exposure dose and a second exposure dose. The determination unit 701 is specifically configured to determine a first preset interval corresponding to the first exposure dose according to a corresponding relationship between an exposure intensity and an exposure time under the first exposure dose; and determine a second preset interval corresponding to the second exposure dose according to a corresponding relationship between an exposure intensity and an exposure time under the second exposure dose.

In some embodiments, the determination unit 701 is specifically configured to determine a third preset interval corresponding to the second exposure dose according to the corresponding relationship between the exposure intensity and the exposure time under the second exposure dose; and determine the second preset interval corresponding to the second exposure dose according to the third preset interval and the first preset interval.

In some embodiments, the determination unit 701 is further specifically configured to determine, in a case that the determined exposure intensity is in the first preset interval, that the target preset interval is the first preset interval; obtain an exposure dose for a to-be-processed wafer; and determine, in a case that the exposure dose for the to-be-processed wafer is the first exposure dose, the to-be-processed wafer as the target wafer.

In some embodiments, the determination unit 701 is further specifically configured to determine, in a case that the exposure intensity is in the second preset interval, that the target preset interval is the second preset interval; obtain an exposure dose for a to-be-processed wafer; and determine, in a case that the exposure dose for the to-be-processed wafer is the second exposure dose, the to-be-processed wafer as the target wafer.

In some embodiments, the determination unit 701 is further configured to output warning information in a case that the exposure intensity is less than a preset lower limit value of the third preset interval, the warning information is used for prompting to replace a mirror of the mask aligner; and perform, in a case that the exposure intensity is greater than or equal to the preset lower limit value of the third preset interval, the operation of determining the target preset interval corresponding to the mask aligner according to the exposure intensity.

In some embodiments, the determination unit 701 is further configured to determine an exposure dose for a to-be-processed wafer in a current batch; determine, in a case that the exposure dose is the target exposure dose, a target preset interval corresponding to the target exposure dose; and determine, according to the target preset interval, a mask aligner of which the exposure intensity is in the target preset interval.

The lithography unit 702 is further configured to dispatch the to-be-processed wafer in the current batch to the mask aligner, and perform lithography process.

It is to be noted that, the lithography apparatus provided in this embodiment of the present disclosure has the same invention idea as that of the lithography method provided in the foregoing embodiment, has similar specific descriptions and similar beneficial effects as that of the method embodiments. For technical details which do not disclosed in the embodiments of the lithography apparatus of the present disclosure, reference is made to the description in the embodiments of the lithography method of the present disclosure.

It may be understood that, in this embodiment, a "unit" may be a part of a circuit, a part of a processor, a part of programs, software, or the like. The unit may also be a module or be non-modular. In addition, components in the embodiments of the present disclosure may be integrated into one processing unit, or each of the units may be physically separated, or two or more units may be integrated into one unit. The foregoing integrated units may be implemented in a form of hardware or software function module.

If implemented in the form of software functional modules and sold or used as an independent product, the integrated units may also be stored in a computer-readable storage medium. Based on this, the technical solutions of the embodiments essentially, or the part contributing to the prior art, or all or a part of the technical solutions may be embodied in the form of a software product. The computer software product is stored in a storage medium and includes several instructions for instructing a computer device (which may be a personal computer, a server, a network device, or the like), or a processor to perform all or some of the steps of the methods described in the embodiments of the present disclosure. The foregoing storage medium includes: various mediums that can store program code, such as a USB flash drive, a removable hard disk, a read-only memory (ROM), a random access memory (RAM), a magnetic disk, or an optical disc.

Therefore, this embodiment provides a computer storage medium having stored therein a computer program, which, when executed by at least one processor, performs the lithography method according to any one of the foregoing lithography method.

Figure 8:
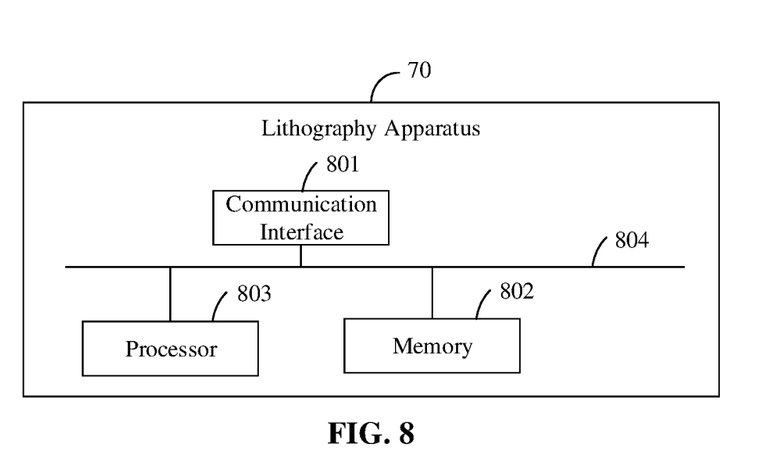
FIG. 8 is a schematic diagram of a specific hardware structure of a lithography apparatus according to some embodiments of the present disclosure.

Based on the components of the lithography apparatus 70 and the computer storage medium, FIG. 8 is a schematic structural diagram of a specific hardware structure of a lithography apparatus 70 according to some embodiments of the present disclosure. As shown in FIG. 8, the lithography apparatus 70 may include: a communication interface 801, a memory 802, and a processor 803, and the components are coupled to each other by using a bus system 804. It may be understood that, the bus system 804 is used for implementing a connection communication between these components. In addition to a data bus, the bus system 804 further includes a power bus, a control bus, and a state signal bus. For ease of clear description, all buses in FIG. 8 are all marked as the bus system 804. The communication interface 801 is configured to receive or transmit signals when receiving or transmitting messages to/from other external network elements.

The memory 802 is configured to store a computer program executable on the processor 803.

The processor 803 is configured to perform, when executing the computer program, the following operations:
  determining an exposure intensity of a mask aligner;
  determining a target preset interval corresponding to the mask aligner according to the exposure intensity;
  determining, according to the target preset interval, at least one target wafer for which at least one exposure dose is a target exposure dose, the target preset interval has a corresponding relationship with the target exposure dose; and
  performing lithography process on the at least one target wafer by using the mask aligner.

It may be understood that, in the embodiments of the present disclosure, the memory 802 may be a volatile memory or non-volatile memory, or may include both volatile and non-volatile memory. The non-volatile memory may be a Read-Only Memory (ROM), a Programmable ROM (PROM), an Erasable PROM (EPROM), an Electrically EPROM (EEPROM), or a flash. The volatile memory may be a Random Access Memory (RAM), functioned as an external high-speed cache. Through examples but not limited description, many forms of RAMs are available, for example, a Static RAM (SRAM), a Dynamic RAM (DRAM), a Synchronous DRAM (SDRAM), a Double Data Rate SDRAM (DDRSDRAM), an Enhanced SDRAM (ESDRAM), a Synchronous link DRAM (SLDRAM), and a Direct Rambus RAM (DRRAM). The memory 802 of the system and method described in the disclosure aims to include, but is not limited to these memories and other suitable memories.

The processor 803 may be an integrated circuit chip capable of processing signals. During implementation, the steps of the foregoing method may be implemented through the integrated logic circuit or instructions in the software form in the processor 803. The foregoing processor 803 may be a general-purpose processor, a Digital Signal Processor (DSP), an Application Specific Integrated Circuit (ASIC), a Field Programmable Gate Array (FPGA), or other programmable logic device, discrete, or transistor logic devices, discrete hardware components. The methods, steps and logical block diagrams disclosed in the embodiments of the present disclosure can be implemented or executed. The general-purpose processor can be a microprocessor or the processor can be any general processor, etc. The steps combined with the method disclosed in the embodiments of the present disclosure can be embodied directly as being executed by the hardware decoding processor or the combination of hardware and software modules in the decoding processor. The software modules can be located in common storage media in the related art, such as a RAM, a flash, a ROM, a programmable RAM, an electrically erasable programmable memory, registers and the like. The storage medium is located in the memory 502, and the processor 503 reads the information in the memory 802 and implements the steps of the method in combination with its hardware.

It may be understood that the embodiments described herein can be implemented in hardware, software, firmware, middleware, microcode, or a combination of the foregoing. When being implemented in hardware, the processing unit may be implemented in one or more Application Specific Integrated Circuits (ASIC), Digital Signal Processing (DSP), DSP Device (DSPD), Programmable Logic Device (PLD), Field-Programmable Gate Array (FPGA), general-purpose processors, controller, microcontrollers, microprocessors, other electronic units used for performing the functions of the present disclosure or a combination thereof.

When being implemented in software, the techniques described herein can be implemented through modules (such as procedures, functions, and so on) that perform the functions described herein. Software code can be stored in the memory and executed by the processor. The memory can be implemented in or outside of the processor.

Optionally, in another embodiment, the processor 803 is further configured to perform, when executing the computer program, the lithography method according to any one of the foregoing embodiments.

For the lithography apparatus 70, by performing an interval division on the exposure intensity of the mask aligner, the mask aligner of which the exposure intensity belongs to the target preset interval can only perform lithography process on the wafer for which the exposure dose is the target exposure dose. Therefore, the use of the mask aligner can be more reasonable, and not only the cost of replacing the mirror is reduced, but also a problem of an increasing exposure time caused by insufficient exposure intensity is avoided, thereby improving a production capability of the mask aligner.

The foregoing is only an exemplary embodiment of the present disclosure and is not intended to limit the scope of protection of the present disclosure.

According to a lithography method, a lithography apparatus, and a computer storage medium provided in the embodiments of the present disclosure, an exposure intensity of a mask aligner is determined; a target preset interval corresponding to the mask aligner is determined according to the exposure intensity; at least one target wafer for which at least one exposure dose is a target exposure dose is determined according to the target preset interval, the target preset interval has a corresponding relationship with the target exposure dose; and lithography process is performed on the at least one target wafer by using the mask aligner. In this case, by performing an interval division on the exposure intensity of the mask aligner, the mask aligner of which the exposure intensity belongs to the target preset interval can only perform lithography process on the wafer for which the exposure dose is the target exposure dose. Therefore, the use of the mask aligner can be more reasonable, and not only the cost of replacing the mirror is reduced, but also a problem of an increasing exposure time caused by insufficient exposure intensity is avoided, thereby improving a production capability of the mask aligner.

It should be noted that, in the present disclosure, the term "including", "comprising" or any of its other variants is intended to cover a non-exclusive contain, therefore, the processes, methods, articles or devices including a series of elements include not only those elements, but also other elements which are not listed, or also include some inherent elements for the processes, methods, articles or devices. Without further limitation, elements limited by the statement "comprises . . . " do not exclude the other identical elements existed in the processes, methods, articles or devices that includes the elements.

The sequence number in the embodiments of the present disclosure is only for description and does not represent the merits of the embodiments.

Methods disclosed in the method embodiments and apparatus embodiments provided in the disclosure may be arbitrarily combined without conflict, to obtain new method embodiments.

Features disclosed in the product embodiments provided in the disclosure may be arbitrarily combined without conflict, to obtain new product embodiments.

Features disclosed in the method embodiments and apparatus embodiments provided in the disclosure may be arbitrarily combined without conflict, to obtain new method embodiments or apparatus embodiments.

The foregoing are only specific implementation of the present disclosure, but the protection scope of the present disclosure is not limited to this. Any changes or replacement that can be easily conceived by a person skilled in the art within the technical scope disclosed in the present disclosure should fall within the protection scope of the present disclosure. Therefore, the protection scope of the present disclosure shall be subject to the protection scope of the appended claims.

The invention claimed is:

1. A lithography method, comprising:
determining an exposure intensity of a mask aligner;
determining a target preset interval corresponding to the mask aligner according to the exposure intensity, the target preset interval is determined from multiple preset intervals according to the exposure intensity, each preset interval represents a range of exposure intensities;
determining, according to the target preset interval, at least one target wafer for which at least one exposure dose is a target exposure dose, the target preset interval has a corresponding relationship with the target exposure dose, the corresponding relationship represents that, in a case that an exposure dose required for performing lithograph process on the wafer is the target exposure dose, when the wafer is processed based on the exposure intensity in the target preset interval, an exposure time may not change due to changes in the exposure intensity in the target preset interval;
performing lithography process on the at least one target wafer by using the mask aligner;
determining at least one corresponding relationship between an exposure intensity and an exposure time under at least one exposure dose; and
determining a preset interval corresponding to each of the at least one exposure dose according to a respective corresponding relationship between an exposure intensity and an exposure time under the exposure dose, the preset interval being used for indicating that the exposure time in the preset interval under the exposure dose remains unchanged;
wherein the at least one exposure dose at least comprises a first exposure dose and a second exposure dose; and
wherein determining the preset interval corresponding to each of the at least one exposure dose according to the respective corresponding relationship between an exposure intensity and an exposure time under the exposure dose comprises:
determining a first preset interval corresponding to the first exposure dose according to a corresponding relationship between an exposure intensity and an exposure time under the first exposure dose; and
determining a second preset interval corresponding to the second exposure dose according to a corresponding relationship between an exposure intensity and an exposure time under the second exposure dose.

2. The method according to claim 1, wherein
the determining the exposure intensity of the mask aligner comprises:
determining an operation state parameter of the mask aligner; and
performing an exposure analysis on the operation state parameter to determine the exposure intensity of the mask aligner.

3. The method according to claim 1, wherein
determining the second preset interval corresponding to the second exposure dose according to the corresponding relationship between the exposure intensity and the exposure time under the second exposure dose comprises:
determining a third preset interval corresponding to the second exposure dose according to the corresponding relationship between the exposure intensity and the exposure time under the second exposure dose; and
determining the second preset interval corresponding to the second exposure dose according to the third preset interval and the first preset interval.

4. The method according to claim 1, wherein
determining the target preset interval corresponding to the mask aligner according to the exposure intensity comprises:
determining, in a case that the exposure intensity is in the first preset interval, that the target preset interval is the first preset interval; and
wherein determining, according to the target preset interval, the at least one target wafer for which the at least one exposure dose is the target exposure dose comprises:
obtaining an exposure dose for a to-be-processed wafer; and
determining, in a case that the exposure dose for the to-be-processed wafer is the first exposure dose, the to-be-processed wafer as a target wafer.

5. The method according to claim 1, wherein
determining the target preset interval corresponding to the mask aligner according to the exposure intensity comprises:
determining, in a case that the exposure intensity is in the second preset interval, that the target preset interval is the second preset interval; and
wherein determining, according to the target preset interval, the at least one target wafer for which the at least one exposure dose is the target exposure dose comprises:
obtaining an exposure dose for a to-be-processed wafer; and
determining, in a case that the exposure dose for the to-be-processed wafer is the second exposure dose, the to-be-processed wafer as a target wafer.

6. The method according to claim 3, further comprising:
after the exposure intensity of the mask aligner is determined,
outputting warning information in a case that the exposure intensity is less than a preset lower limit value of the third preset interval, the warning information being used for prompting to replace a mirror of the mask aligner; and
performing, in a case that the exposure intensity is greater than or equal to the preset lower limit value of the third preset interval, the operation of determining the target preset interval corresponding to the mask aligner according to the exposure intensity.

7. The method according to claim 1, further comprising:
determining an exposure dose for a to-be-processed wafer in a current batch;
determining, in a case that the exposure dose is the target exposure dose, a target preset interval corresponding to the target exposure dose;
determining, according to the target preset interval, a mask aligner of which the exposure intensity is in the target preset interval; and
dispatching the to-be-processed wafer in the current batch to the mask aligner, to perform lithography process.

8. A lithography apparatus, comprising:
a memory; and
a processor,
wherein the memory is configured to store a computer program executable on the processor; and
the processor is configured to perform, when executing the computer program, following operations:
determining an exposure intensity of a mask aligner;
determining a target preset interval corresponding to the mask aligner according to the exposure intensity, the target preset interval is determined from multiple preset intervals according to the exposure intensity, each preset interval represents a range of exposure intensities;
determining, according to the target preset interval, at least one target wafer for which at least one exposure dose is a target exposure dose, the target preset interval has a corresponding relationship with the target exposure dose, the corresponding relationship represents that, in a case that an exposure dose required for performing lithograph process on the wafer is the target exposure dose, when the wafer is processed based on the exposure intensity in the target preset interval, an exposure time may not change due to changes in the exposure intensity in the target preset interval; and
performing lithography process on the at least one target wafer by using the mask aligner;
determine at least one corresponding relationship between an exposure intensity and an exposure time under at least one exposure dose; and
determine a preset interval corresponding to each of the at least one exposure dose according to a respective corresponding relationship between an exposure intensity and an exposure time under the exposure dose, the preset interval is used for indicating that the exposure time in the preset interval under the exposure dose remains unchanged;
wherein the at least one exposure dose at least comprises a first exposure dose and a second exposure dose; and
the processor is further configured to:
determine a first preset interval corresponding to the first exposure dose according to a corresponding relationship between an exposure intensity and an exposure time under the first exposure dose; and
determine a second preset interval corresponding to the second exposure dose according to a corresponding relationship between an exposure intensity and an exposure time under the second exposure dose.

9. The lithography apparatus according to claim 8, wherein
the processor is further configured to:
determine an operation state parameter of the mask aligner; and
perform an exposure analysis on the operation state parameter to determine the exposure intensity of the mask aligner.

10. The lithography apparatus according to claim 8, wherein
the processor is further configured to:
determine a third preset interval corresponding to the second exposure dose according to the corresponding relationship between the exposure intensity and the exposure time under the second exposure dose; and
determine the second preset interval corresponding to the second exposure dose according to the third preset interval and the first preset interval.

11. The lithography apparatus according to claim 8, wherein
the processor is further configured to:
determine, in a case that the exposure intensity is in the first preset interval, that the target preset interval is the first preset interval;
obtain an exposure dose for a to-be-processed wafer; and
determine, in a case that the exposure dose for the to-be-processed wafer is the first exposure dose, the to-be-processed wafer as a target wafer.

12. The lithography apparatus according to claim 8, wherein
the processor is further configured to:
determine, in a case that the exposure intensity is in the second preset interval, that the target preset interval is the second preset interval;
obtain an exposure dose for a to-be-processed wafer; and
determine, in a case that the exposure dose for the to-be-processed wafer is the second exposure dose, the to-be-processed wafer as a target wafer.

13. The lithography apparatus according to claim 10, wherein
the processor is further configured to:
output warning information in a case that the exposure intensity is less than a preset lower limit value of the third preset interval, the warning information is used for prompting to replace a mirror of the mask aligner; and
perform, in a case that the exposure intensity is greater than or equal to the preset lower limit value of the third preset interval, the operation of determining the target preset interval corresponding to the mask aligner according to the exposure intensity.

14. The lithography apparatus according to claim 8, wherein
the processor is further configured to:
determine an exposure dose for a to-be-processed wafer in a current batch;
determine, in a case that the exposure dose is the target exposure dose, a target preset interval corresponding to the target exposure dose;
determine, according to the target preset interval, a mask aligner of which the exposure intensity is in the target preset interval; and
dispatch the to-be-processed wafer in the current batch to the mask aligner to perform lithography process.

15. A non-transitory computer storage medium having storing therein a computer program which, when executed by at least one processor, cause the at least one processor to perform following operations:
determining an exposure intensity of a mask aligner;
determining a target preset interval corresponding to the mask aligner according to the exposure intensity, the target preset interval is determined from multiple preset intervals according to the exposure intensity, each preset interval represents a range of exposure intensities;

determining, according to the target preset interval, at least one target wafer for which at least one exposure dose is a target exposure dose, the target preset interval has a corresponding relationship with the target exposure dose, the corresponding relationship represents that, in a case that an exposure dose required for performing lithograph process on the wafer is the target exposure dose, when the wafer is processed based on the exposure intensity in the target preset interval, an exposure time may not change due to changes in the exposure intensity in the target preset interval;

performing lithography process on the at least one target wafer by using the mask aligner;

determining at least one corresponding relationship between an exposure intensity and an exposure time under at least one exposure dose; and determining a preset interval corresponding to each of the at least one exposure dose according to a respective corresponding relationship between an exposure intensity and an exposure time under the exposure dose, the preset interval being used for indicating that the exposure time in the preset interval under the exposure dose remains unchanged;

wherein the at least one exposure dose at least comprises a first exposure dose and a second exposure dose; and wherein determining the preset interval corresponding to each of the at least one exposure dose according to the respective corresponding relationship between an exposure intensity and an exposure time under the exposure dose comprises:

determining a first preset interval corresponding to the first exposure dose according to a corresponding relationship between an exposure intensity and an exposure time under the first exposure dose; and determining a second preset interval corresponding to the second exposure dose according to a corresponding relationship between an exposure intensity and an exposure time under the second exposure dose.

16. The non-transitory computer storage medium of claim 15, wherein the computer program, when executed by the at least one processor, cause the at least one processor further to:

determine an operation state parameter of the mask aligner; and perform an exposure analysis on the operation state parameter to determine the exposure intensity of the mask aligner.

\* \* \* \* \*